(12) United States Patent
Achter

(10) Patent No.: US 7,852,669 B2
(45) Date of Patent: Dec. 14, 2010

(54) DIVISION-BASED SENSING AND PARTITIONING OF ELECTRONIC MEMORY

(75) Inventor: Michael Achter, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 386 days.

(21) Appl. No.: 11/687,436

(22) Filed: Mar. 16, 2007

(65) Prior Publication Data

US 2008/0225607 A1 Sep. 18, 2008

(51) Int. Cl.
*G11C 11/40* (2006.01)

(52) U.S. Cl. .............................. 365/185.03; 365/185.02; 365/185.2

(58) Field of Classification Search ............ 365/185.03, 365/185.02, 185.2
See application file for complete search history.

(56) References Cited

U.S. PATENT DOCUMENTS

| | | | | | |
|---|---|---|---|---|---|
| 5,867,429 | A | * | 2/1999 | Chen et al. | 365/185.33 |
| 6,594,181 | B1 | * | 7/2003 | Yamada | 365/185.21 |
| 7,180,780 | B1 | * | 2/2007 | Ho et al. | 365/185.18 |
| 7,352,628 | B2 | * | 4/2008 | Kamei | 365/185.2 |
| 2004/0208057 | A1 | * | 10/2004 | Hamilton et al. | 365/185.03 |
| 2006/0274581 | A1 | * | 12/2006 | Redaelli et al. | 365/185.22 |
| 2008/0089122 | A1 | * | 4/2008 | O | 365/185.2 |

OTHER PUBLICATIONS

International Search Report and Written Opinion dated Jun. 20, 2008 for PCT Application Serial No. PCT/US2008/057138, 36 Pages.
Office Action for European Application Serial No. 08743943.6-2210, dated Jun. 17, 2010, 11 pages.

* cited by examiner

*Primary Examiner*—Hoai V Ho
*Assistant Examiner*—Jay Radke
(74) *Attorney, Agent, or Firm*—Turocy & Watson, LLP

(57) ABSTRACT

Providing distinction between overlapping threshold levels of one or more multi-cell memory devices is described herein. By way of example, a system can include a sensing component that can measure a level associated with a first memory cell. The system can also include a comparison component that can compare the measured level associated with the first memory cell level to non-overlapping threshold levels, wherein such measurement can be used to determine a unique bit level associated with a second memory cell. By way of further example, methodologies are described for accurately measuring a bit level of a first cell of a dual-cell memory device, by comparing a second cell value to non-overlapping threshold values, as measured with respect to the second reference point.

20 Claims, 15 Drawing Sheets

DIVISION-BASED SENSING AND PARTITIONING OF ELECTRONIC MEMORY

BACKGROUND

Memory devices have a wide variety of uses in modern electronics, including computers, cameras, voice recorders, cell phones, portable storage drives, and similar devices. In addition, many types of memory devices have been developed to effectuate such uses. Flash memory, for example, is one type of electronic memory media that can store, erase and restore data. Furthermore, flash memory, unlike some types of electronic memory, can retain stored data without continuous electrical power. Flash memory has become a popular device for consumer electronics, due in part to a combination of the high density and low cost of erasable programmable read only memory (EPROM) and electrical erasability introduced with electronically erasable programmable read only memory (EEPROM). In addition to combining these benefits, flash memory is nonvolatile (e.g., flash memory can be removed from a power source without losing stored data). Consequently, it has become a useful and popular mechanism for storing, transporting, sharing and maintaining data.

To further evolve technical capabilities associated with flash memory devices, multiple storage cells have been implemented therewith. Multiple storage cells associated with a flash memory device can typically increase a density and consequently a storage capacity of such device. For example, a dual storage cell enables a single flash memory chip to store two data bits on a single chip. Some side effects can result from multi cell devices, however, as a bit (e.g., represented by a quantized voltage or current level) stored in one cell can affect a voltage or current level, representing a particular bit, of an adjacent cell. In some situations electrical characteristics associated with two different bits of a memory cell can overlap, making those bits difficult to distinguish. Such a condition can produce a memory read error if a device is unable to distinguish between two or more bits that can be stored within a cell. To increase reliability and accuracy associated with flash memory, read errors should be reduced or eliminated where possible.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The disclosed subject matter provides for differentiating between overlapping memory cell bits in a multi-cell memory device. In accord with aspects of the claimed subject matter, a first memory cell bit can be differentiated from a second, overlapping bit by comparing an adjacent memory cell with a reference level that does not overlap at least one bit of the adjacent cell. By differentiating between non-overlapping bits of the adjacent cell, at least one potential bit level associated with the first memory cell can be discarded. By alternate measurement between a first and adjacent memory cell, and choosing a new reference point that does not overlap at least one bit of a measured cell, a measured bit level can be distinguished from all other potential bit levels associated with a cell. Consequently, read errors associated with overlapping bits can be mitigated.

In accordance with additional aspects of the subject disclosure, read errors associated with one or more quad-bit, dual cell memory devices can be mitigated. Individual bits of a quad-bit cell can be partially differentiated by comparison with a reference point that does not overlap one or more of the bits. Further differentiation occurs when an adjacent memory cell is measured and compared to a second reference point that does not overlap at least one bit associated with the second cell. Still further differentiation can occur, resulting in a specified bit level of a quad bit cell, by re-comparing the first quad bit cell with a new reference point that does not overlap remaining bits associated with the first cell. According to alternate aspects of the claimed subject matter, the second reference point can be compared with a measured bit of the first cell to distinguish up to two remaining overlapping bit pairs, where the second reference does not overlap at least two of the overlapping bit pair levels associated with the first memory cell.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
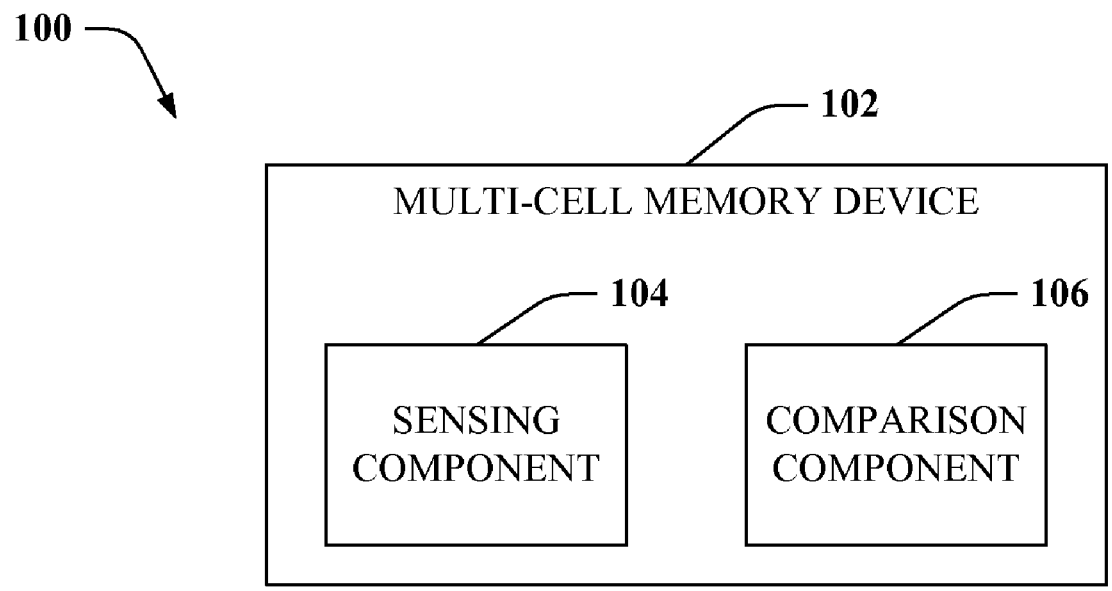
FIG. 1 depicts an example high-level block diagram of a system that facilitates sensing a memory cell bit in accord with aspects of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

As utilized herein, terms "component," "system," "interface," "engine," and the like are intended to refer to a computer-related entity, either hardware, a combination of hardware and software, software (e.g., in execution), and/or firmware. For example, a component can be a process running on a processor, a processor, an object, an executable, a program, and/or a computer. By way of illustration, both an application running on a server and the server can be a component. One or more components can reside within a process and/or thread of execution and a component can be localized on one computer and/or distributed between two or more computers. As another example, an interface can include I/O components as well as associated processor, application and/or API components, and can be as simple as a command line or a more complex Integrated Development Environment (IDE).

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications may be made to this configuration without departing from the scope or spirit of the claimed subject matter.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

The disclosed subject matter relates to systems and/or methods that facilitate accurately retrieving data in quad-bit, multi cell memory devices (e.g., non-volatile flash memory). In accordance with one aspect of the disclosed subject matter, overlapping data bit levels of a multi-bit memory cell can be iteratively distinguished via comparison with neighboring cell levels. A sensing component can be employed to facilitate measuring a programmed bit level of the multi-bit memory cell (e.g., a dual-cell memory device). A reference component can provide a constant electrical characteristic (e.g., voltage, charge and/or current) to serve as a measurement reference level, against which a bit level can be contrasted. Furthermore, the reference level can be chosen such that two or more non-overlapping data bits of the memory cell or of a neighboring memory cell bound such reference level. More specifically, overlapping bit levels measured with respect to a particular cell may not overlap as measured with respect to a neighboring cell. Consequently, by choosing an appropriate reference level with respect to the neighboring cell, overlapping bits of a first cell can be distinguished.

With reference now to FIG. 1, a system 100 is illustrated that facilitates accurate reading of a multi-cell memory device 102 (e.g., a quad-bit, dual cell device). Multi-cell memory device 102 can include non-volatile memory, such as flash memory, read only memory (ROM), programmable ROM (PROM), erasable programmable read only memory (EPROM), electronically erasable programmable read only memory (EEPROM), and the like. As an example, multi-cell memory device 102 can include non-volatile memory (e.g., flash memory, multi-bit flash memory, and like memory) that further includes multi-level, multi-bit flash memory cells. Multi-bit memory cells can typically be programmed to multiple target levels that can represent multiple data bits. As a more specific example, a multi-bit cell can be programmed to four discrete levels (e.g., B1, B2, B3, B4) corresponding to varying amounts of electric charge stored within a memory cell. Furthermore, B1 can correspond to an unprogrammed state (e.g., a lowest amount of electric charge); B2 can be a programmed state having an electric charge higher than B1, B3 can be an additional programmed state having an electric charge higher than B1 and B2, and B4 can be a highest programmed state having an electric charge still higher than B1, B2, and B3.

With reference now to FIG. 1, a system 100 is illustrated that facilitates accurate reading of a multi-cell memory device 102 (e.g., a quad-bit, dual cell device). Multi-cell memory device 102 can include non-volatile memory, such as flash memory, read only memory (ROM), programmable ROM (PROM), erasable programmable read only memory (EPROM), electronically erasable programmable read only memory (EEPROM), and the like. As an example, multi-cell memory device 102 can include non-volatile memory (e.g., flash memory, multi-bit flash memory, and like memory) that further includes multi-level, multi-bit flash memory cells. Multi-bit memory cells can typically be programmed to multiple target levels that can represent multiple data bits. As a more specific example, a multi-bit cell can be programmed to four discrete levels (e.g., B1, B2, B3, B4) corresponding to varying amounts of electric charge stored within a memory cell. Furthermore, B1 can correspond to an unprogrammed state (e.g., a lowest amount of electric charge); B2 can be a programmed state having an electric charge higher than B1, B3 can be an additional programmed state having an electric charge higher than B1 and B2, and B4 can be a highest programmed state having an electric charge still higher than B1, B2, and B3.

Multi-cell memory device 102 can include two or more adjacent memory cells that can be independently programmed to different bit levels. For example, two adjacent cells of multi-cell memory device 102 can be programmed to an appropriate level (e.g., electric charge) representing data bits B1 and B2 (hereinafter referred to as B1-B2 or a B1-B2 state). As stated above, B1 and B2 can indicate an unprogrammed state in one memory cell and a first programmed state in an adjacent memory cell, for instance. Typically, multi-cell memory devices (e.g., multi-cell memory device 102) can exhibit a level-shift phenomenon, where a bit level of one cell can be affected and shifted by a programmed bit level of an adjacent cell (e.g., when differing charges in adjacent cells partially average their respective values). More specifically, level-shift can cause a programmed bit level of one cell to deviate from a discrete threshold level typically associated with the programmed bit level.

The following example illustrates a level-shift phenomenon. Assume a bit level B1 typically corresponds to a range of charge between 5 and 7 and a bit level B2 typically corresponds to an amount of charge between 9 and 11. A first cell programmed to a B1 level and an adjacent cell programmed to a B2 level can, for instance, result in level-shift, such that an actual charge stored within the first cell is greater than the typical 5-7 range (e.g., 8), or an actual charge stored within the second cell is less than the typical 9-11 range (e.g., 10), or both. More specifically, a B1-B2 state can result in a level associated with the first memory cell between 6 and 8, a B1-B3 state in a first memory cell level between 7 and 9, and a B1-B4 state in a cell level between 8 and 10. As a result, it can be difficult to differentiate between certain bit levels, illustrated by this example, as a shifted level nears a level corresponding to a different bit level (e.g., as the charge in the first cell overlaps the 9-11 range associated with a B2 level).

In accordance with aspects of the claimed subject matter, system 100 can distinguish between overlapping bit levels (e.g., as illustrated by the previous example) of a first cell by sensing bit levels of an adjacent cell, comparing such adjacent bit levels to a typical threshold bit level as measured with respect to the adjacent cell, and eliminating bits dissimilar to the adjacent bit level. Sensing component 104 can measure a discrete bit level (e.g., level of electric charge) stored within one or more cells of multi-cell memory device 102. Sensing component 104 can include, for example, an electric current meter, charge meter, voltage meter, or related device, electrical process, processor or combination thereof that can identify and distinguish electrical characteristics (e.g., current, charge, voltage, resistance etc.) associated with an electronic component (e.g., multi-cell memory device 102). Bit levels measured by sensing component 104 can be transferred to a comparison component 106 for relation to a non-overlapping threshold bit level.

A non-overlapping threshold bit level can be any constant bit level (e.g., charge, voltage, etc.) between threshold and shifted levels of one programmed bit, or group of bits, and threshold and shifted levels of a second programmed bit, or group of bits, where the first and second threshold and shifted levels do not overlap. Referring to the previous example, a non-overlapping reference between bits B1, B2 (threshold and shifted values that range from 5 to 14) and bits B3, B4 (threshold and shifted values that range from 15 to 23) can be 14.5. By measuring the first memory cell with respect to level 14.5, a B1/B2 bit level can be distinguished from a B3/B4 bit level, and vice versa. Additionally, because bit levels that overlap with respect to one memory cell (e.g., B1-B4 with charge 8-10 and B2-B1 with charge 9-11) can be distinct with respect to an adjacent memory cell (e.g., B1-B4 measured with respect to a first cell can have charge 8-10, but when measured with respect to the second cell, the adjacent bit becomes a B4-B1 that can have charge 19-21, easily distinguishable from bits that overlap B1-B3/4, B2-B1, for instance, with respect to the first cell), sensing a bit level of the adjacent cell can facilitate distinction between overlapping bit states of the first cell.

The following example illustrates one particular aspect of the subject innovation, to provide context for the disclosure; it should be appreciated that the subject disclosure is not limited to the example embodiment. For a dual-cell, quad-bit device 16 program states can exist (e.g., 4 variations of one cell corresponding with 4 variations of a second cell; 4×4=16 variations). A discussion of all 16 states is presented infra. For introductory purposes, 5 states will be discussed, B1-B1, B1-B2, B1-B3, B1-B4, and B2-B1. For the purpose of this example, assume that B1-B1 and B2-B1 have a threshold level associated with the first memory cell that typically can be between 5-7 and 9-11 respectively (likewise, B3-B1 and B4-B1 states can have a threshold level associated with the first memory cell that typically can be 15-17 and 19-21 respectively). As a result of level shifting, a measured level associated with the first memory cell can depend on a program state of the second memory cell. More specifically, assume for this example that the level-shift range associated with the first memory cell of B1-B2, B1-B3, and B1-B4 states can typically be 6-8, 7-9, and 8-10 respectively. Consequently, a typical shifted B1 for the first memory cell can overlap a typical B2 level, when the second memory cell is either a B3 or B4 state. Therefore, employing a sensing component (104) to measure a state corresponding with the second memory cell and a comparison component (106) to relate that measured state to a typical reference can indicate what level the first memory cell is programmed to.

Continuing the example, sensing a level of the first memory cell can be insufficient to determine whether such cell is in a B1 or B2 state, because of the level shift and resulting overlap at high program states associated with the second cell. More specifically, if a sensing component (104) determines a level of 9 for the first cell, such cell can be in either a B1 state or a B2 state. Consequently, the sensing component (104) can determine a level associated with the second memory cell, and a comparison component (106) can relate such second cell level to an appropriate reference and determine a bit level of the second cell. More specifically, if the sensing component (104) determines that a level for the second cell is also 9, the comparison component (106) can compare such level to a reference between one or more bit levels associated with the second cell. For example a reference between 14 and 15 is sufficient to distinguish B1 (5-7, shifted up to 10) and B2 (9-11, shifted up to 14) levels from B3 (15-17, shifted up to 20) and B4 (19-21, shifted up to 24) levels. Consequently, the comparison component (106) can determine that the second cell must be in a B1 or B2 state. By determining that the second cell is in a B1 or B2 state, information regarding the first cell becomes determinable.

System 100 can distinguish overlapping bit levels for multi-cell memory device 102 in accord with the previous example. Thus, sensing component 104 can measure a level of the first memory cell. Comparison component 106 can compare the first cell level to a reference point (e.g., a 14-15 reference point between B1, B2 and B3, B4 states as indicated supra). If such comparison is insufficient to distinguish a cell level associated with the first memory cell (e.g., because the cell level is in a region that can overlap two or more level shifted bits, such as level 9 that overlaps B1-B3/B4 and B2-B1) sensing component 104 can measure a level of the second cell. Comparison component 106 can compare the second cell level to a reference to eliminate bit levels dissimilar to the second cell level (e.g., eliminate states B*-B1 and B*-B2 [where B* indicates any state associated with a cell, the first cell as used here] if the second level is greater than 14-15, or eliminate states B*-B3 and B*-B4 if the second cell level is less than 14-15). By iteratively choosing reference points between overlapping state levels, and comparing adjacent cell levels to such reference points, system 100 can determine a bit level for each cell of multi-cell memory device 102.

Figure 2:
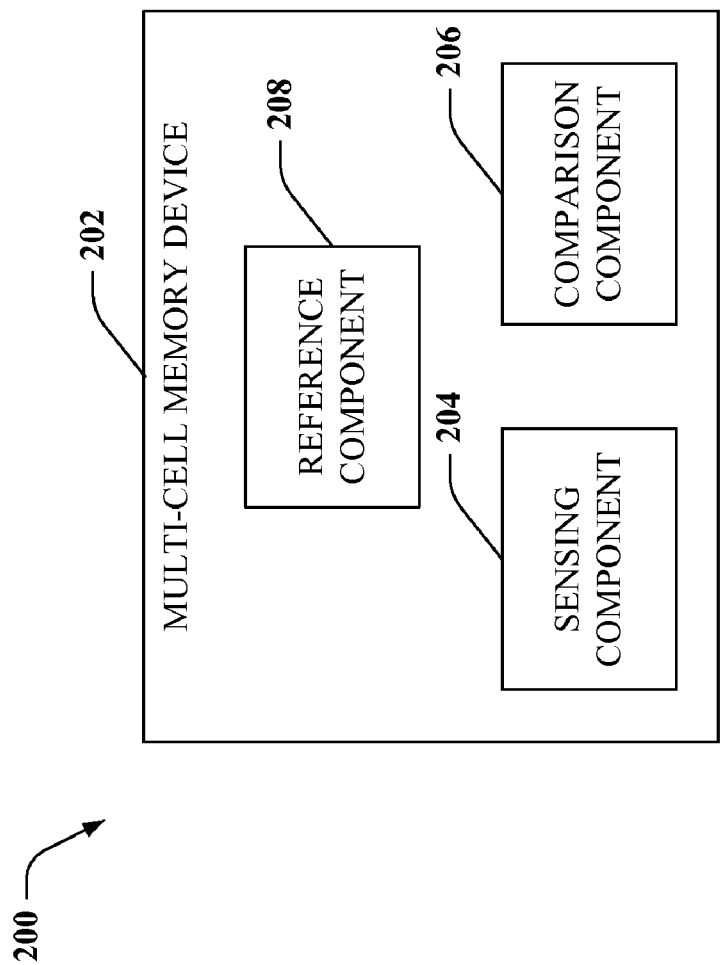
FIG. 2 depicts an example system that distinguishes between overlapping memory cell bits in accord with aspects of the subject matter disclosed herein.

Referring now to FIG. 2, a system 200 is illustrated that provides a constant reference level for comparison to memory cell levels of multi-cell memory device 202. Multi-cell memory device can be any suitable memory device having multiple memory cells (e.g., quad-bit, dual-cell memory device), including non-volatile memory, such as flash memory (supra). Sensing component 204 can measure a stored level (e.g., current, charge, voltage, etc.) of a memory cell that can correspond to a discrete threshold level (e.g., a memory bit). Comparing component can relate a measured cell level to a constant level to distinguish a cell level between discrete threshold levels, and facilitate reading a bit stored within a memory cell.

System 200 can further provide multiple mechanisms for establishing a constant level for comparison to measured cell levels. Reference component 208 can iteratively choose a plurality of constant references (e.g., associated with a charge, current, voltage, etc. of a system or memory cell) bounded by non-overlapping cell bit levels. In reference to the example presented in FIG. 1, supra, a constant reference bounded by non-overlapping cell bit levels for non-level shifted B1 and B2 bits can be a level of 8 (e.g., in relation to dual bit values of B1-B1 and B2-B1, where no level shift from the default level occurs). A constant reference provided by reference component 208 can include, for instance, a constant measurable current, a non-varying bit, an experimentally determined level, a level inferred from another level and information related to a memory device, or combinations thereof.

Reference component 208 can facilitate differentiation between overlapping and non-overlapping multi-cell bit states (e.g., B1-B4 and B2-B1 states of a dual-cell memory device). By choosing a reference between non-overlapping states in an adjacent memory cell, overlapping states can be eliminated in a first memory cell. In reference to the example provided supra, for a dual-cell memory device, adjacent cell levels B1-B4 and B2-B1 can overlap, such that sensing a level of the first memory cell can be insufficient to determine whether such memory cell is in a B1 or B2 state (e.g., non-programmed or programmed at a first level). However, with respect to an adjacent, second memory cell, the B1-B4 measured as a B4-B1 bit (e.g., if a B1 charge is typically 8 and a B4 charge is typically 20, a B1-B4 memory state indicates a first cell charge of 8 and a second cell charge of 20. Measuring with respect to a first cell indicates a relative disparity of 8-20, or B1-B4. Measuring with respect to the second cell, however, indicates a relative disparity of 20-8, or B4-B1). If it can be determined that the second cell is in a B4 state, or alternatively that the second cell is not in a B1 state, then the B2-B1 state (as measured with respect to the first cell) is discarded, leaving only the B1-B4 state as a possible dual-cell state. Thus, in this example the first cell is in a B1 state. To facilitate accurate cell reading, reference component 208 can choose a constant reference between non-overlapping states, as measured with respect to a second cell, to discard one or more such states that do overlap with respect to a first cell.

Figure 3:
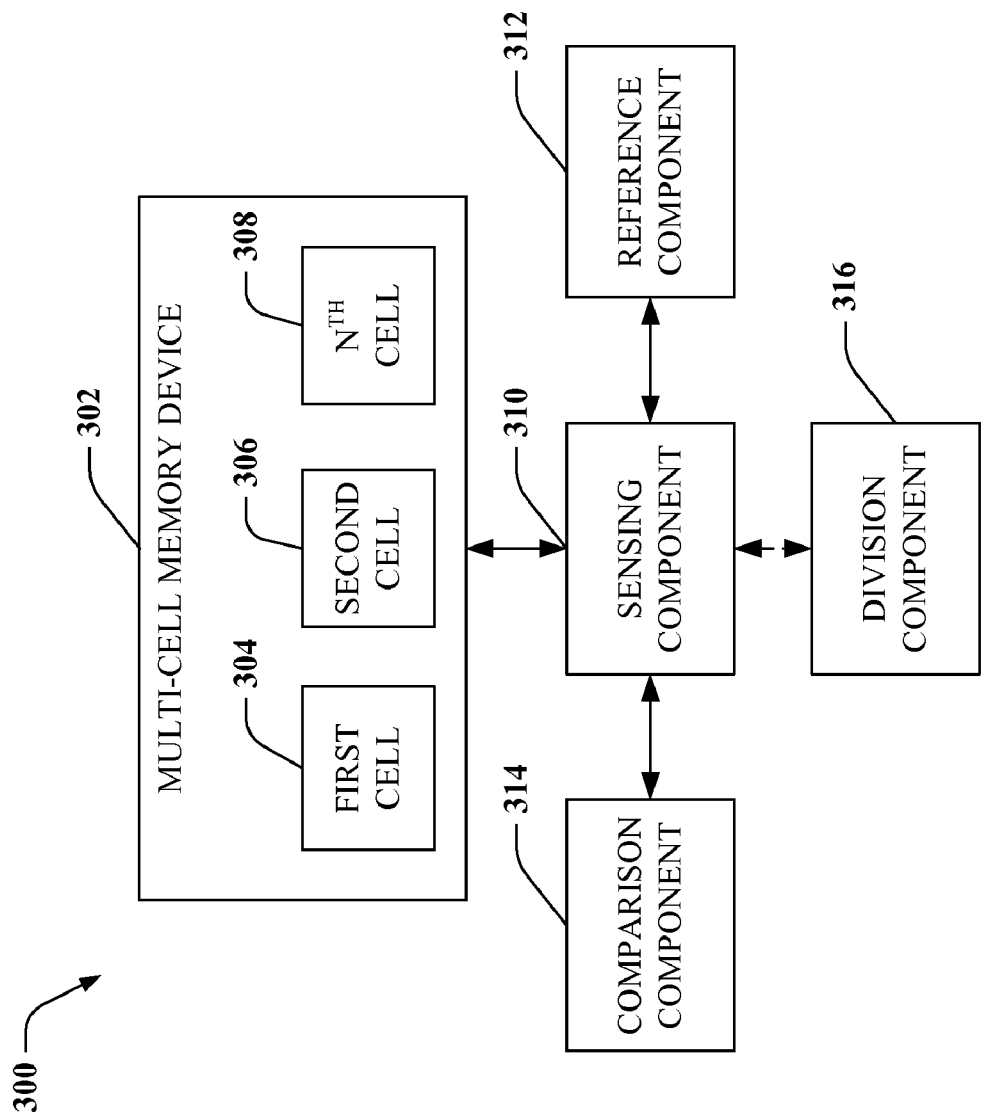
FIG. 3 depicts an exemplary system that mitigates read errors related to a memory cell by eliminating cell bits in relation to a reference level.

FIG. 3 depicts an example system 300 for accurately reading memory bit levels in a multi-cell memory device 302, in accord with aspects of the subject disclosure. Multi-cell memory device 302 can have multiple memory cells, a first memory cell 304, a second memory cell 306, through an $N^{TH}$ memory cell 308 (where N is an integer). Each of memory cells 304 through 308 can have multiple bits (e.g., corresponding to multiple threshold bit levels) related thereto. Sensing component 310 can measure a level associated with a memory cell (304-308) (e.g., relating to a charge, voltage, current etc., stored in such cell). Such memory cell level can be measured, for instance, with respect to a constant reference chosen by a reference component 312 (e.g., as indicated supra). Additionally, comparison component 314 can compare a measured memory cell level with a threshold level corresponding to a discrete memory bit. Such a discrete memory bit can represent a programming state associated with a memory cell (e.g., non-programmed state, first programmed state, etc.) Such comparison can distinguish one programming state from another, facilitating reading a bit stored within a memory cell (304-308).

Additionally, system 300 can include a division component 316 that can iteratively discard threshold bit levels that do not correspond to a measured cell level (e.g., determined by sensing component 310), as compared with a reference level (e.g., chosen by reference component 312). More specifically, if a reference level is chosen between bits B2 and B3, and a measured, cell level is equivalent to a B2 bit or less, division component 316 can discard bits corresponding to B3 and B4. In accord with various aspects of the subject innovation, division component 316 can facilitate distinction between overlapping bits, as measured with respect to a first memory cell, by discarding bits that do not correspond with a measured cell level of a second cell, as compared to a reference level of the second cell. As a more specific example, if cell levels B1-B4 and B2-B1 overlap as measured with respect to a first cell, an adjacent cell level can be measured (e.g., by sensing component 310), a reference level of non-overlapping bits can be determined with respect to the second cell (e.g., between B1/B2 bits and B3/B4 bits, or charges of value 5-7 and 9-11 versus 15-17 and 19-21, for instance), the cell level can be compared to the reference level, and dissimilar bit levels (above the reference level if the second cell level is below such reference, or vice versa) can be discarded by division component 316. Such discarded bits can be ignored when referring back to the first cell, and remaining overlapping bits of memory cells (304-308) can be further distinguished. By iteratively sensing, comparing, referencing, and discarding overlapping bits, system 300 can facilitate accurate reading of bits stored by memory cells (304-308) of multi-cell memory device 302.

Figure 4:
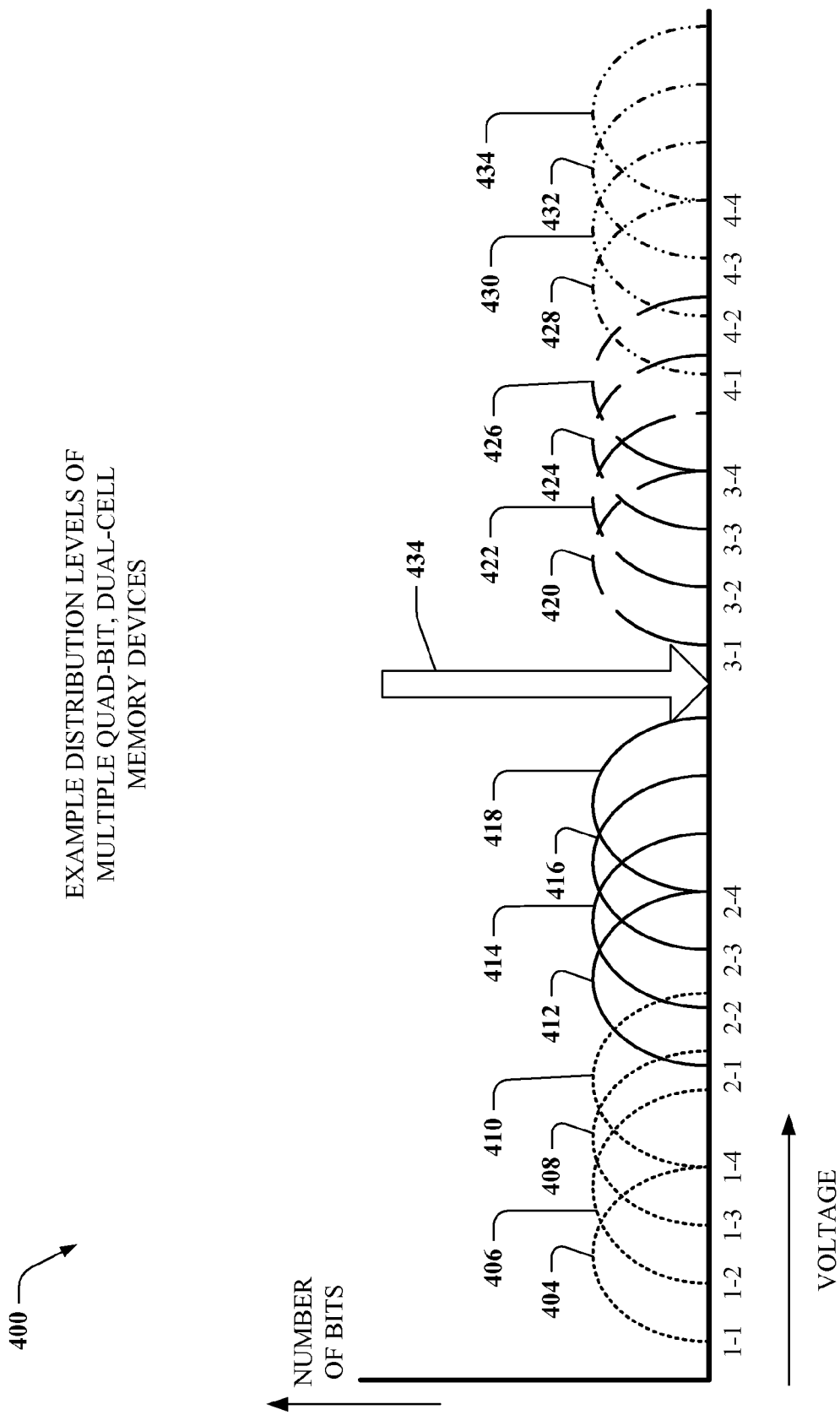
FIG. 4 illustrates an example of overlapping bit distribution levels of one or more quad-bit dual cell memory devices in accord with aspects disclosed herein.

Referring now to FIG. 4, a diagram 400 is provided that displays overlapping threshold bit distribution levels associated with multiple quad-bit, dual-cell memory devices, in accord with aspects of the subject innovation. Diagram 400 indicates bit distribution levels as a function of voltage (e.g., threshold voltage, or $V_T$, in a horizontal axis, and a number of measured bits of a group of memory cells in a vertical axis). Dual-cell threshold bit states 404, 406, 408, and 410 correspond to 1-1, 1-2, 1-3, and 1-4 states (the first number indicating a bit level of a group of initially measured cells, the second number indicating a bit level of a group of adjacent, subsequently measured cells) of the dual-cell memory devices, respectively (e.g., each dual-cell memory device can have a 'left' and a 'right' cell, a first group can include all initially measured, left cells of the memory devices and a second group can include all subsequently measured, right cells of the memory devices, or similar variations). Consequently, bit states 1-1 through 1-4 (404, 406, 408, 410) indicate states in which a first group of memory cells is in a constant state (e.g., B1, a non-programmed state, or the like) and a second, adjacent group of cells is in one of four bit states (e.g., B1-B4 as discussed above).

Level-shifting is evident with respect to bit states 412-434, as is depicted by the varying voltage ranges associated with a particular group of cells having an otherwise constant bit state (e.g., a 1 state, including 1-1, 1-2, 1-3, 1-4 states as depicted). More specifically, 1-1 state 404 can encompass a voltage range ending at a point where, for instance, 1-4 state 410 begins. States 1-3 408, and 1-4 410 also can overlap dual-cell bit states associated with a second bit level (e.g., B2 level, discussed above) of the first (measured) group of cells, for example. Consequently, diagram 400 indicates an exemplary memory device state in which measurement of an individual group of cells can be inconclusive to determine a bit level associated with such cells.

Bit states 2-1 through 2-4 (412, 414, 416, 418) indicate states in which a first group of cells is in a second state (e.g., B2 state, or first programmed state), and a second, adjacent group of cells is in one of 4 bit states (e.g., B1-B4). Bit states 3-1 through 3-4 (420, 422, 424, 426) indicate states in which the first group of cells is in a third state (e.g., B3 state, or second programmed state, higher than the first programmed state) and the second, adjacent group of cells is in one of 4 bit states (e.g., B1-B4). Additionally, bit states 4-1 through 4-4 (428, 430, 432, 434) indicate states in which the first group of cells is in a fourth state (e.g., B4 state, or third programmed state, higher than the first and second programmed state), and the second, adjacent group of cells is in one of 4 bit states (e.g., B1-B4, etc.)

Reference point 434 indicates a non-overlapping voltage region associated with a first group of memory cells, between bit values 1,2 and 3,4. Consequently, measuring a cell level of the first group of memory cells with respect to reference point 434 can provide a determination as to whether the first group of cells is in a first or second, or third or fourth bit state. States dissimilar to the measured cell level, as compared with reference point 434, therefore, can be discarded (e.g., if a measured level is less than reference point 434, bit states 3 and 4 of the first group of cells can be discarded; if a measured level is greater than reference point 434, bit states 1 and 2 of the first group of cells can be discarded, etc.)

Figure 5:
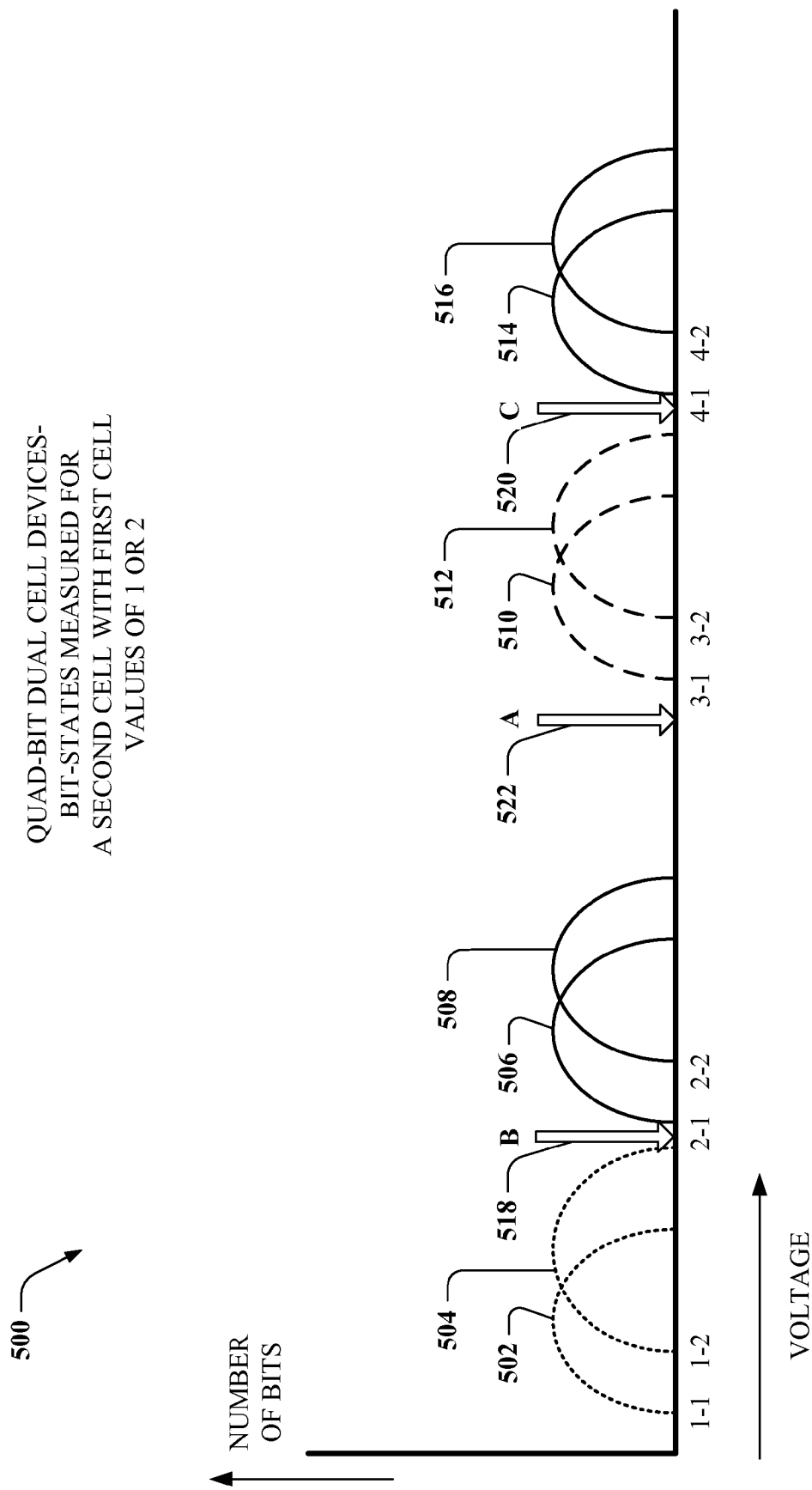
FIG. 5 illustrates an example of comparing a second cell and a second reference level associated with one or more quad bit dual cell memory devices to further distinguish overlapping bit distribution levels in accord with aspects disclosed herein.

Referring now to FIG. 5, an example threshold graph 500 of threshold bit distribution levels associated with multiple quad-bit memory cell devices) is illustrated, for first memory cell values of 1 and 2 (e.g., corresponding to unprogrammed or first level programmed states). Additionally, FIG. 5 depicts a measurement of second cell threshold values. Consequently, reference numerals (1-1, 1-2, etc.) are shifted with respect to FIG. 4 such that the first number now represents a bit state of a second group of memory cells, and the second number represents a bit state of the first group of memory cells (see FIG. 4, supra). For example, wherein bit state 1-2 as illustrated in FIG. 4 relates to the first group of memory cells having bit state 1 and second group of memory cells having bit state 2, reference number 1-2 as depicted in FIG. 5 relates to the second group of memory cells having bit 1 and first group of memory cells having bit 2. In sum, FIG. 5 depicts reference numbers having a first number that corresponds to a bit state of the second group of memory cells, and a second number that corresponds to a bit state of the first group of memory cells.

FIG. 5 depicts dual-cell bit state values wherein the first group of memory cells includes values of 1 and 2 only. Consequently, the second number of each bit state reference number will include only values of 1 and 2. As the threshold graph 500 depicts, when measuring with respect to the second group of memory cells, bit states that overlapped with respect to the first group of memory cells (depicted in FIG. 4) are no longer overlapping. For example, bit states 1-4 and 2-1 overlap with respect to the first group of memory cells (depicted in FIG. 4). However, measuring with respect to the second group of memory cells results in a comparison of bit states 4-1 and 1-2, which are clearly distinguishable as depicted in FIG. 5. Bit states 1-1, 1-2, 2-1, and 2-2 (502, 504, 506, 508) are separated by a threshold level gap indicated by reference B 518. By comparing a measured bit state of the second group of memory cells with reference B 518, second cell states of 1 and 2 can be distinguished. Additionally, states 3-1, 3-2, 4-1, and 4-2 (510, 512, 514, 516) are separated by a threshold gap indicated at reference C 522. Consequently, second cell values of 3 and 4 can be distinguished by comparing such values to reference C 522. Additionally, second cell states of 1 and 2 can easily be distinguished from states 3 and 4 by comparison to reference A 522. Consequently, threshold graph 500 depicts a state of multiple quad-bit, dual-cell memory devices in which values of a second group of memory cells can be uniquely determined by comparing distributions of the measured cell level of the second group of memory cells with respect to references A, B, and/or C (522, 518, 520).

Figure 6:
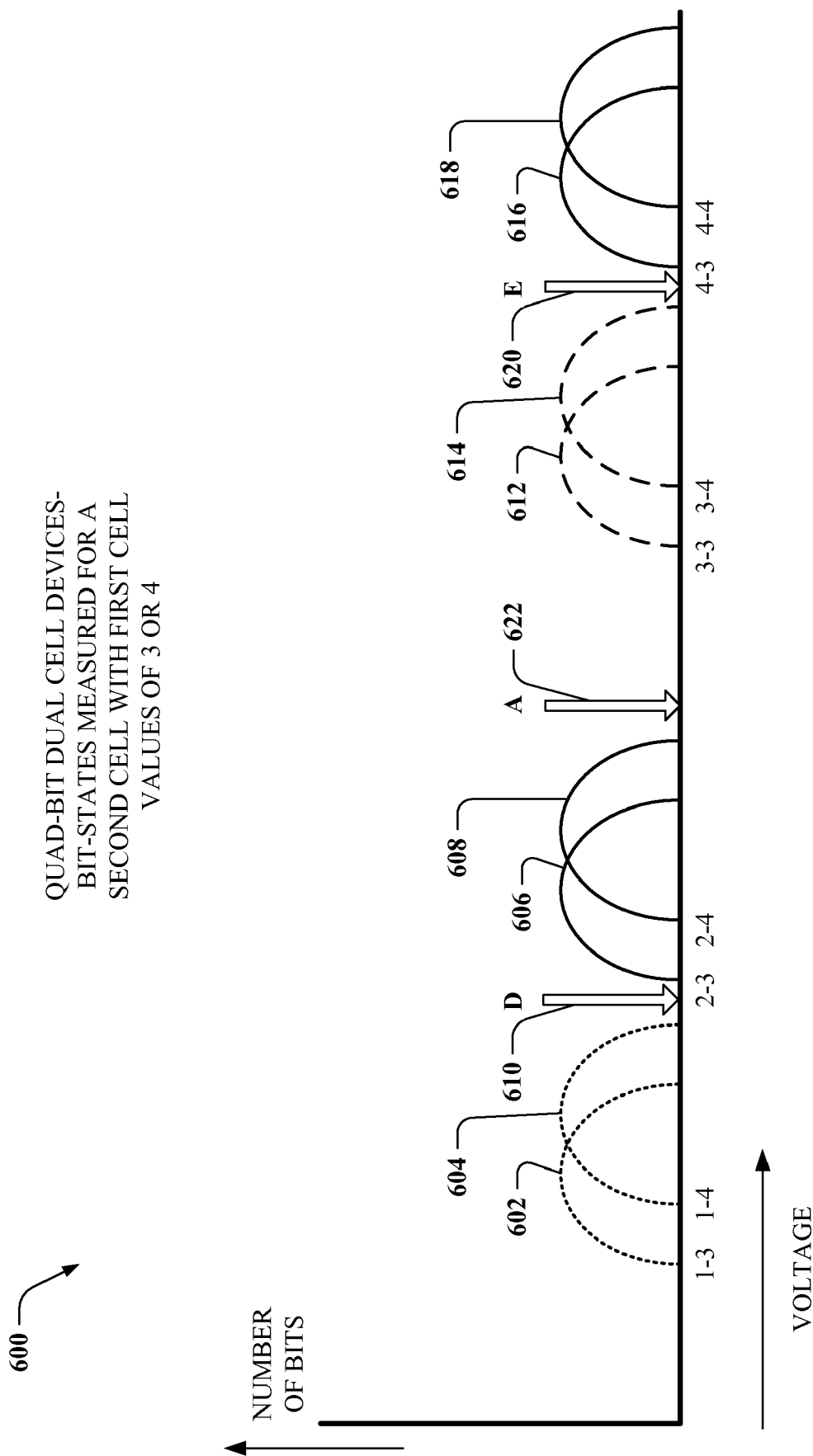
FIG. 6 illustrates a further example of separating bit distribution levels in accord with comparison to a first reference level.

FIG. 6 depicts a threshold graph 600 of multiple quad-bit, dual-cell memory devices having a first memory cell bit distribution level corresponding to a bit 3 or bit 4 threshold. Similar to threshold graph 500 (FIG. 5), threshold graph 600 depicts threshold state values as measured with respect to a second memory cell. Consequently, the first number in a dual-cell state reference (e.g., 1-3, 1-4, 3-3, etc.) corresponds to a bit state associated with a group of second cells, and the second number of the dual-cell state reference corresponds to a bit state associated with a group of first memory cell state. States 1-3, 1-4, 2-3, and 2-4 (602, 604, 606, 608) are separated by a threshold gap indicated at reference D 610. Consequently, measuring a level of the second group of cells and comparing such level to reference D 610 can distinguish a second cell state of 1 or 2.

States 3-3, 3-4, 4-3, and 4-4 (612, 614, 616, 618) are separated by a threshold gap indicated at reference E 620. As a result, measuring a level of the second group of cells and comparing such level to reference E 620 can distinguish a second cell state of 3 or 4. Furthermore, second cell states of 1, 2, 3, or 4 can be distinguished by comparing a measured level of the second group of cells to either of references A, D, or E (622, 610, and 620, respectively). In sum, measurement of the first group of memory cells and comparison to the threshold gap indicated at reference A 434 (FIG. 4), where such comparison distinguishes first memory cell group values of 1 or 2 from first cell group values of 3 or 4, is sufficient to uniquely identify the second memory cell group value indicated in FIGS. 5 and 6 (corresponding to first cell levels of 1 or 2 and 3 or 4, respectively) by measurement of the second memory cell group value. In other words, discarding first cell states of 1 and 2 or 3 and 4, for memory device threshold levels depicted in FIG. 4, is sufficient to determine a non-overlapping reference point between each bit level of the second memory cell group.

Figure 7:
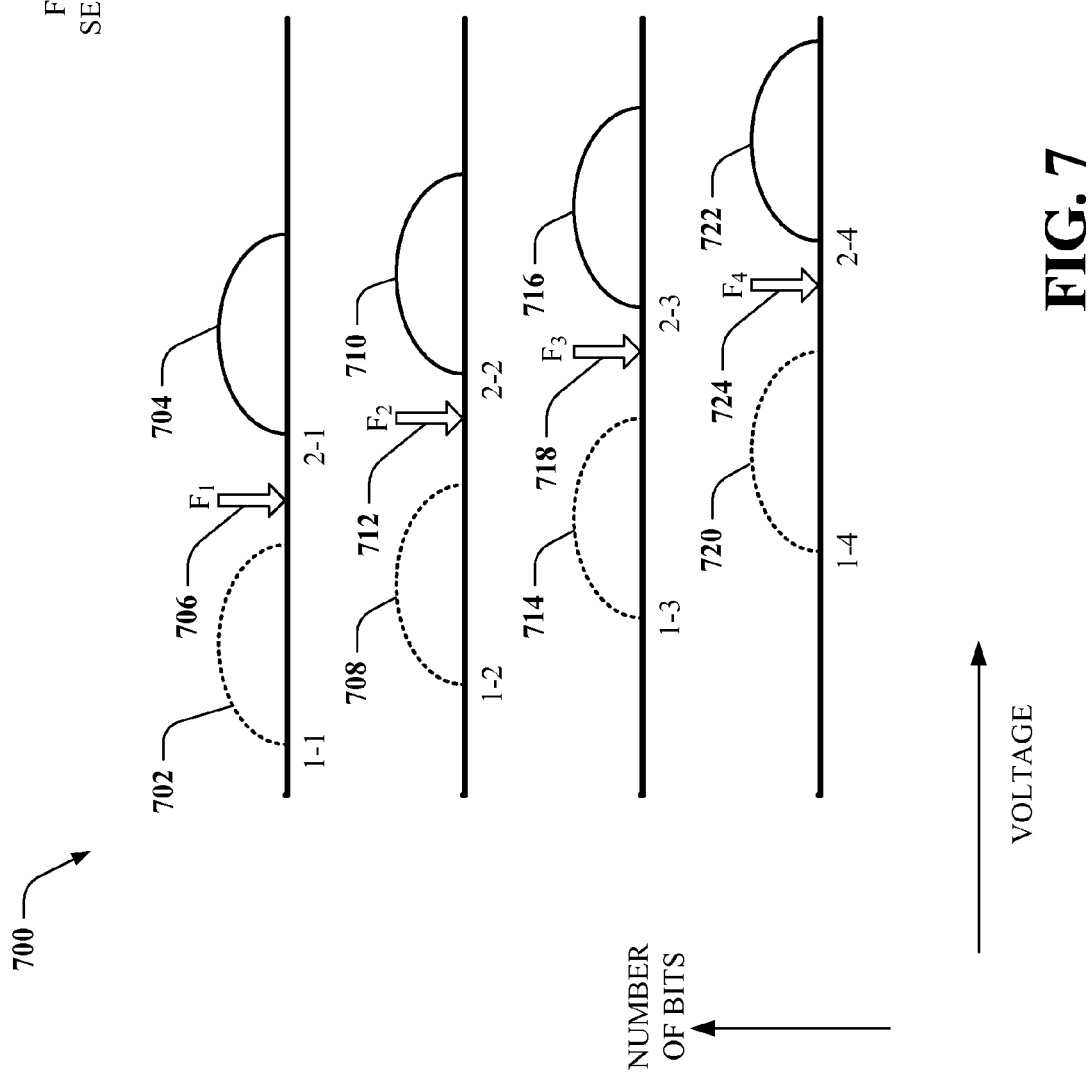
FIG. 7 depicts an example of distinguishing overlapping bit distribution levels by comparing the first memory cell with a third reference level between remaining bits associated with the first memory cell.

With reference now to FIG. 7, sample threshold graphs 700 are depicted that indicate threshold values for first and second bit states of a first memory cell group (referring to FIG. 4) for uniquely determined second memory cell group states. Measurement is with respect to the first group of memory cells (as in FIG. 4), such that a dual-cell reference number (e.g., 1-1, 2-1, etc.) has a first number corresponding to the first memory cell group value and a second number corresponding to the second memory cell group value. After unique determination of a second cell bit state for first cell states of 1 or 2 (see FIG. 5), the remaining first cell states can be separated by a threshold level gap indicated at references $F_{1-4}$ (706, 712, 718, 724). More specifically, if the second cell group bit is 1, first cell states 1 and 2 (702 and 704) are separated by a threshold gap at reference $F_1$ 706; if the second cell group bit is 2, first cell states of 1 and 2 (708 and 710) are separated by a threshold gap at reference $F_2$ 712; if the second cell group bit is 3, first cell states of 1 or 2 (714 and 716) are separated by a threshold gap at reference $F_3$ 718; and if the second cell group bit is 4, first cell states of 1 or 2 (720 and 722) are separated by a threshold gap at reference $F_4$ 724. A further measurement of the first cell group level (or further comparison of the initial measurement of the first cell group level) and comparison to an appropriate reference can therefore uniquely determine a bit level associated with the first group of memory cells.

Figure 8:
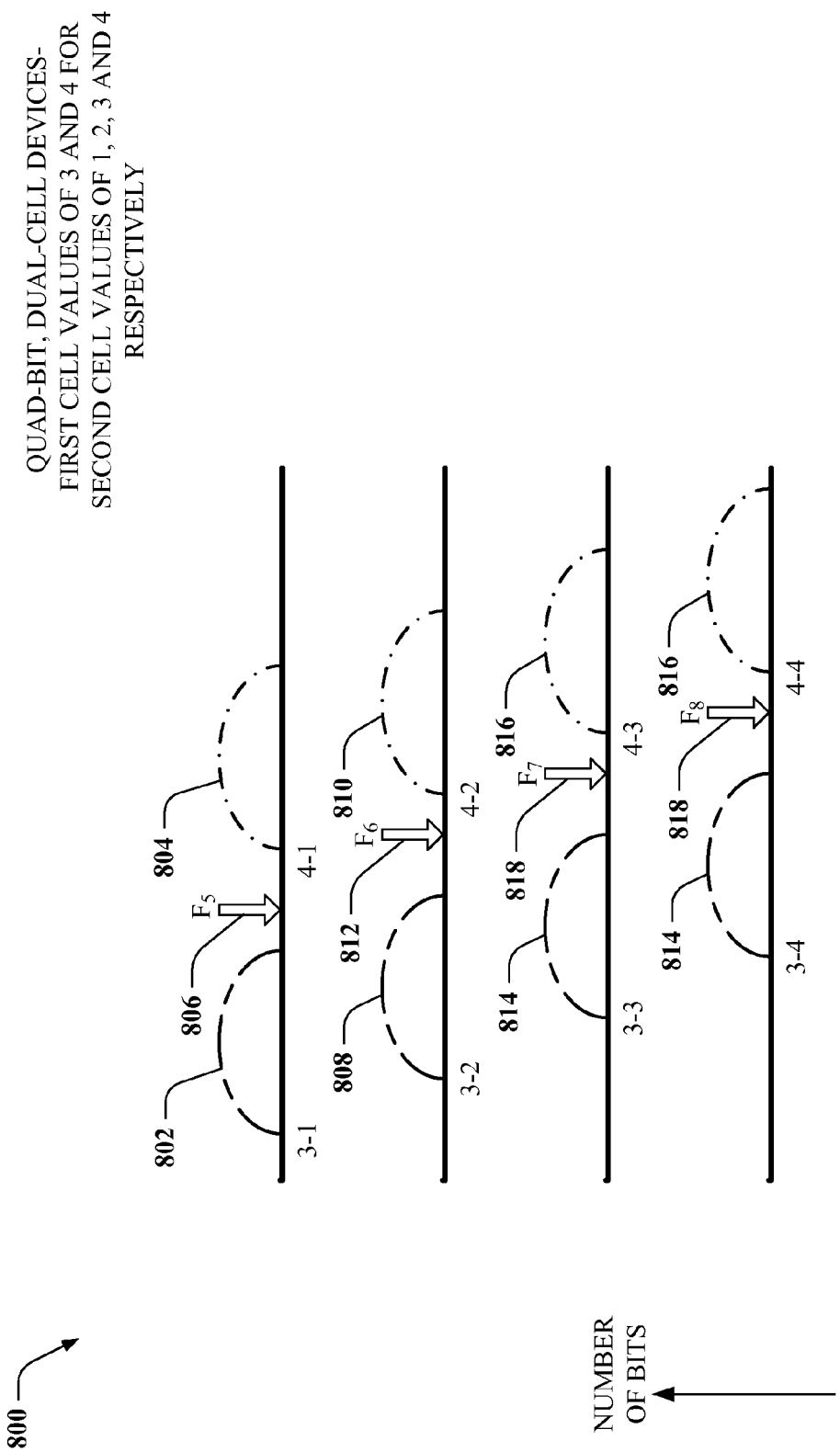
FIG. 8 depicts an example of distinguishing overlapping bit distribution levels of one or more memory cells in accord with particular aspects.

Referring now to FIG. 8, threshold graphs 800 are depicted that indicate threshold values for third and fourth bit states of a first group of memory cells (referring to FIG. 4) for uniquely determined second memory cell states. Measurement is with respect to the first group of memory cells (as in FIG. 4), such that a dual-cell reference number (e.g., 1-1, 2-1, etc.) has a first number corresponding to the first memory cell group value and a second number corresponding to the second memory cell group value. After unique determination of a second cell bit state for first cell states of 3 or 4 (see FIG. 6), the remaining first cell states can be separated by a threshold level gap indicated at references $F_{5-8}$ (706, 712, 718, 724), substantially similar to that indicated at FIG. 7 for first cell states of 1 or 2 and references $F_{1-4}$. Consequently, a comparison of the measurement of the first cell group level to an appropriate reference can uniquely determine a bit level associated with the first group of memory cells. In such a manner, depicted at FIGS. 4-8, overlapping bit levels associated with a group of memory cells can be distinguished, to facilitate accurate measurement of multiple quad-bit, dual-cell memory devices in accord with aspects of the subject innovation.

Figure 9:
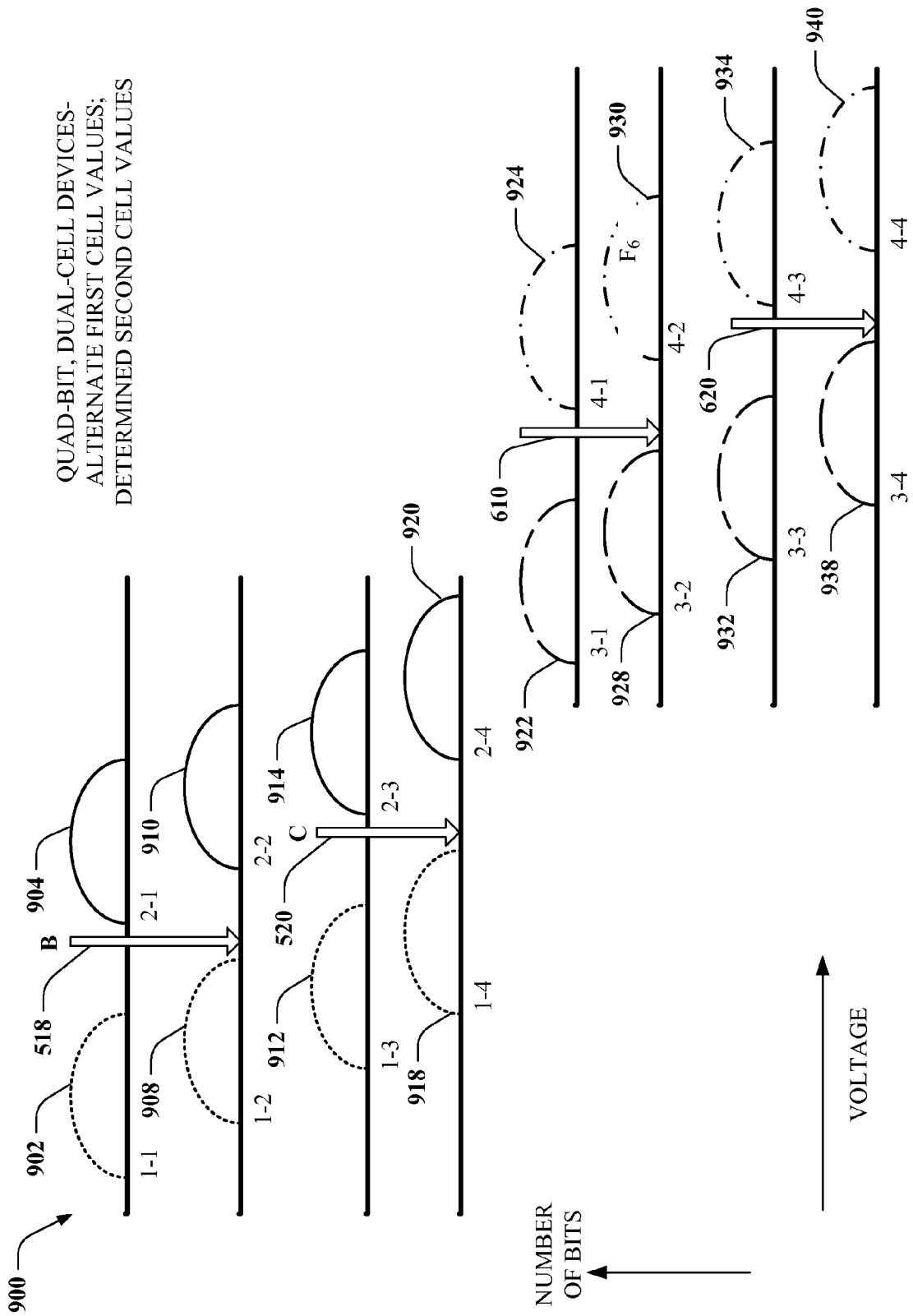
FIG. 9 illustrates alternative aspects wherein a common reference level can be utilized to distinguish between two or more overlapping distribution levels of a first memory cell.

With reference now to FIG. 9, additional aspects of the subject disclosure are depicted for distinguishing overlapping bit levels of multiple quad-bit, dual-cell memory devices. Example threshold graphs 900 illustrate an embodiment of the subject innovation wherein a common reference point, determined for non-overlapping bits with respect to a second group of memory cells, can serve to distinguish first memory cell group bit values for multiple second cell bit values. More specifically, first memory cell group bits corresponding to states 1-1, 2-1, 1-2, 2-2 (902, 904, 908, 910), having second cell group bit states of either 1 or 2 can be commonly distinguished by reference B 518 (see FIG. 5). Likewise, first memory cell group bits corresponding to states 1-3, 2-3, 1-4, and 2-4 (912, 914, 918, 920), having second cell group states of either 3 or 4 can be commonly distinguished by reference C 520 (see FIG. 5). Additionally first memory cell group bits corresponding to states 3-1, 4-1, 3-2, 4-2 (922, 924, 928, 930) and 3-3, 4-3, 3-4, 4-4 (932, 934, 938, 940) can be uniquely distinguished by references D and E (610 and 620) respectively (see FIG. 6). As illustrated, a reference point between suitable non-overlapping memory cell threshold bit distribution levels can serve as a point of distinction for overlapping threshold bit distribution levels of an adjacent group of memory cells. Consequently, threshold graphs 900 indicate additional aspects of the subject disclosure that facilitate distinction between multiple overlapping cell bit levels via common reference levels.

Figure 10:
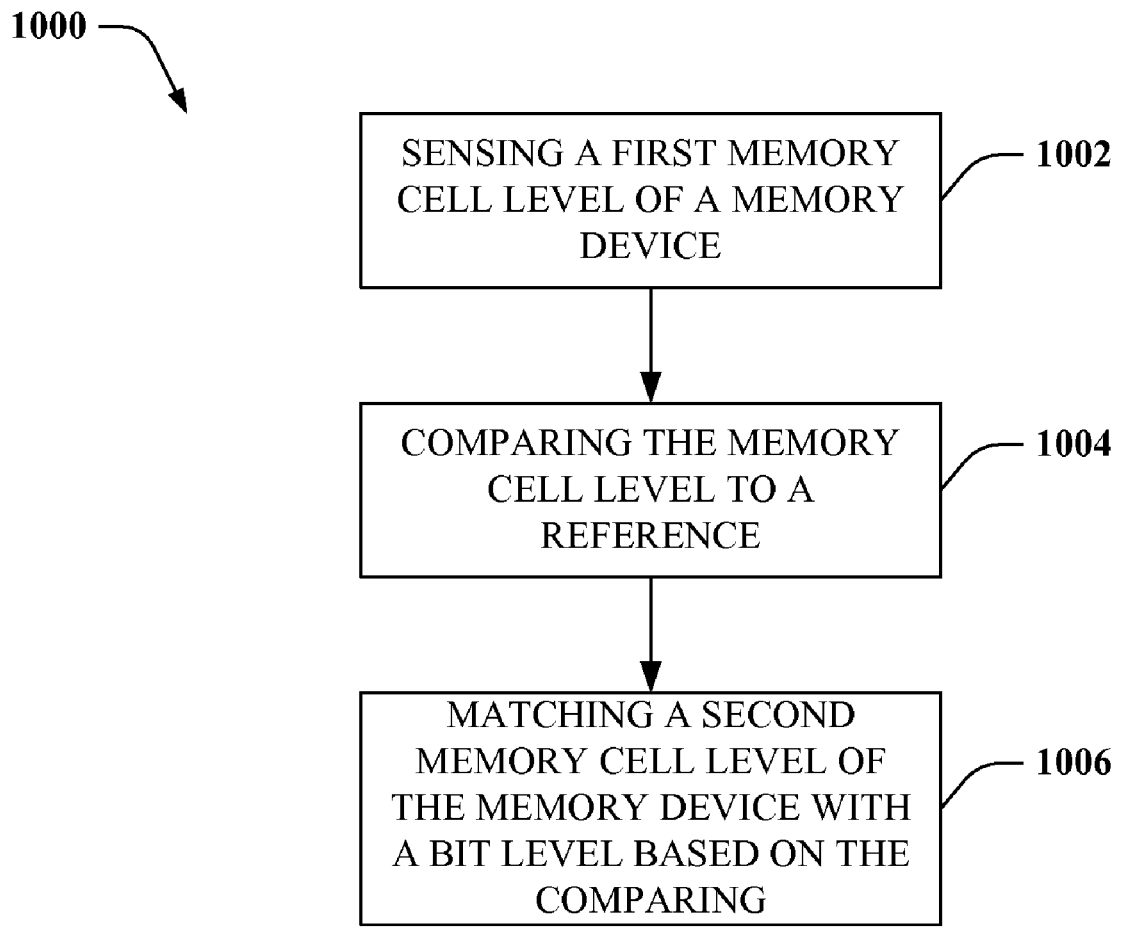
FIG. 10 depicts a methodology for reading a memory cell in accord with the claimed subject matter.
Figure 11:
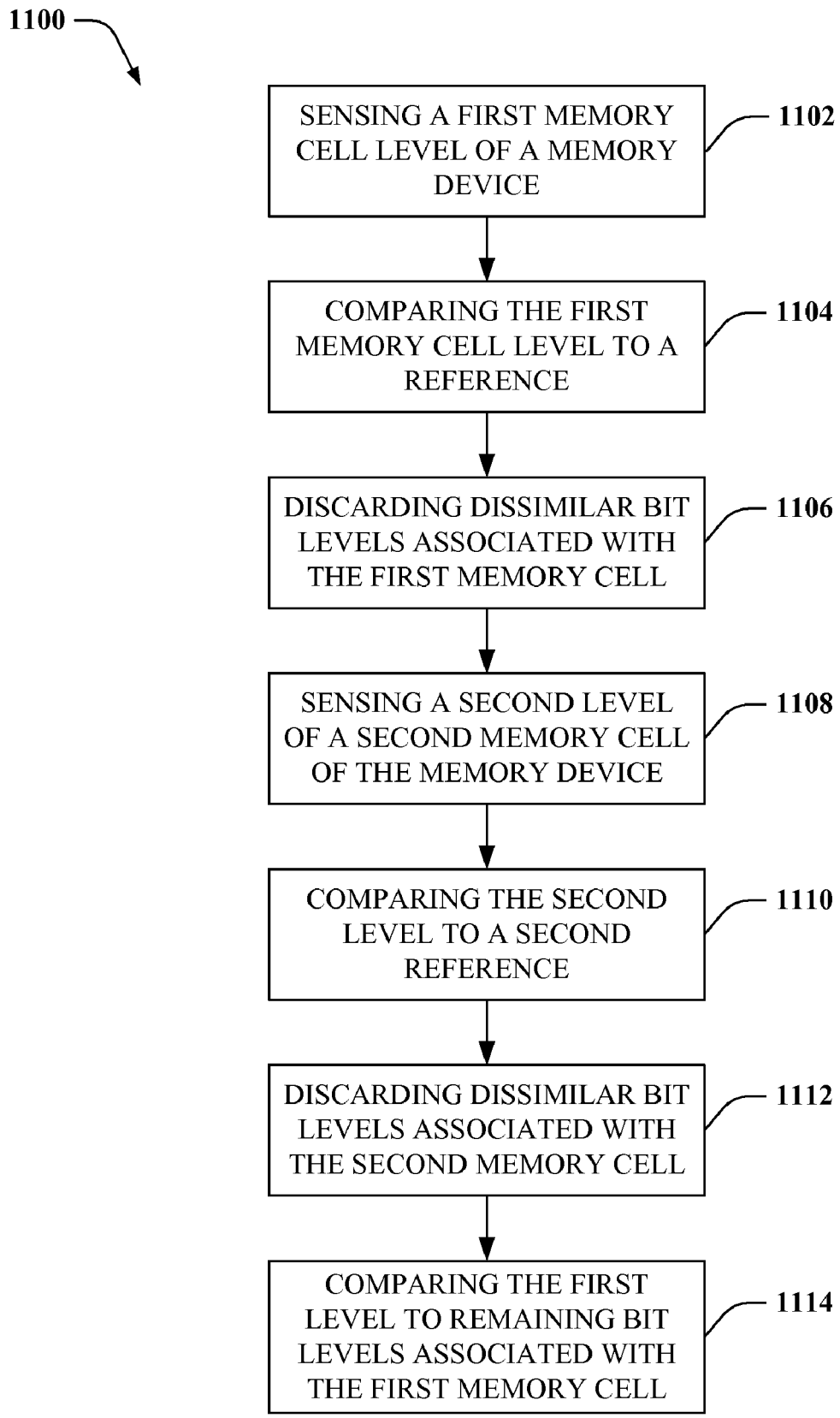
FIG. 11 illustrates a methodology for distinguishing overlapping bits of a quad bit dual cell memory device in accord with additional aspects.
Figure 12:
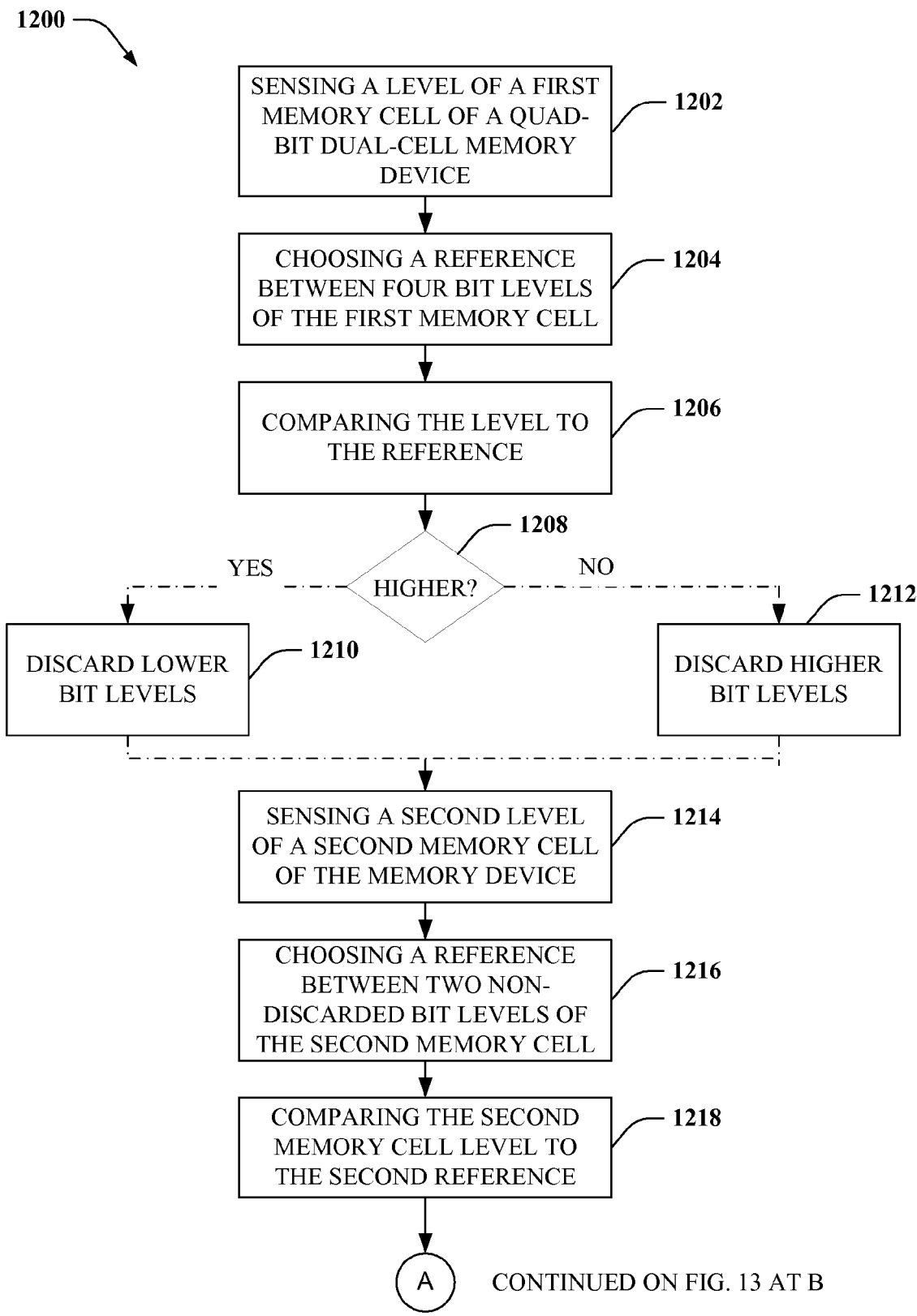
FIGS. 12 and 13 illustrate a flowchart relating to an example methodology for reading a quad-bit dual cell memory device in accord with particular aspects of the claimed subject matter.

FIGS. 10-12 illustrate example methodologies in accordance with the disclosed subject matter. For purposes of simplicity of explanation, the methodologies are depicted and described as a series of acts. It is to be understood and appreciated that the claimed subject matter is not limited by the acts illustrated and/or by the order of acts, for acts associated with the example methodologies can occur in different orders and/or concurrently with other acts not presented and described herein. For example, those skilled in the art will understand and appreciate that a methodology could alternatively be represented as a series of interrelated states or events, such as in a state diagram. Moreover, not all illustrated acts can be required to implement a methodology in accordance with the claimed subject matter. Additionally, it should be further appreciated that the methodologies disclosed hereinafter and throughout this specification are capable of being stored on an article of manufacture to facilitate transporting and transferring such methodologies to computers.

FIG. 10 depicts an example methodology for distinguishing between overlapping bit levels of a dual-cell memory device in accord with aspects of the claimed subject matter. At 1002, a first memory cell level of a multi-cell memory device is sensed. Such a multi-cell memory device can include non-volatile memory, such as flash memory, ROM, PROM, EPROM, EEPROM, and the like. Furthermore, such multi-cell memory device can include multi-level, multi-bit flash memory cells that can typically be programmed to multiple target levels that can represent multiple data bits. As a more specific example, a multi-bit cell can be programmed to four discrete levels (e.g., B1, B2, B3, B4) corresponding to varying amounts of electric charge stored within a memory cell. For example, B1 can correspond to an unprogrammed state, B2 to a programmed state having an electric charge higher than B1, B3 to a programmed state having an electric charge higher than B1 and B2, and B4 to a highest programmed state having an electric charge still higher than B1, B2, and B3.

Sensing of the memory cell level at 1002 can be performed by a sensing component, including, for example, a device or process, or combination of a device and process that can measure a current, voltage, charge, or like electronic characteristic, or similar electronic measurement component that can measure such characteristic. It is to be appreciated, that cell levels of memory cells adjacent to the first memory cell can affect the cell level associated with the first memory cell. Consequently, a memory cell level of a multi-cell device can depend on a program state of multiple memory cells. Furthermore, memory cell levels corresponding to a first state of a memory cell can overlap with another state of the memory cell (e.g., due to adjacent programmed cells). Consequently, measurement of a first memory cell level of a memory device at 1002 can be insufficient to adequately determine a bit level state (e.g., B1, B2, B3, B3) associated with such first memory cell level.

At 1004, the memory cell level is compared to a reference. The reference can distinguish, for example, between threshold levels or groups of levels that overlap and other threshold levels or groups of levels that do not overlap (e.g., if B1 and B2 threshold levels of the first memory cell do not overlap with corresponding B3 and B4 threshold levels, the reference can be in between such non-overlapping groups of threshold levels). Additionally, the reference can distinguish between threshold levels that overlap as measured with respect to the first memory cell, but do not overlap as measured with respect to a second memory cell adjacent (or otherwise able to affect a threshold level stored in the fist memory cell) to the first memory cell.

At 1006, a second memory cell level of the memory device is matched with a bit level based on the comparing. Such matching can occur, for example, by discarding bit levels dissimilar to the first memory cell value, as compared to the reference. More specifically, if a first and second bit level are similar to a measured first cell level with respect to a reference point (for instance, the first and second bit levels and the measured first cell level are all less than the reference), then bit levels corresponding with a third and fourth level of the first memory cell can be discarded, both with respect to the first memory cell and the matching of the second memory cell level at 1006. As described herein, methodology 1000 can distinguish between overlapping bit levels of a multi-cell memory device by comparison between a reference point and bit levels of a first, and/or second adjacent memory cell device.

FIG. 11 depicts an example methodology 1100 that can distinguish between overlapping bit levels of a multi-cell memory device in accord with additional aspects of the subject innovation. At 1102, a first memory cell level of a memory device can be sensed. Such memory cell can be adjacent to additional memory cells, wherein a cell level of the first memory cell can affect and be affected by cell levels of the additional memory cells. At 1104, the first memory cell level can be compared to a reference. Such reference can include a threshold level between one or more non-overlapping threshold bit levels as measured with respect to the first memory cell and/or with respect to the additional memory cells. At 1106, dissimilar bit levels associated with the first memory cell are discarded. Such discarding can be as a result of the comparison at 1104, where dissimilar bit levels are determined in comparison to the reference (e.g., if a measured first cell level is higher than a reference, then bit levels that are lower than the reference can be discarded as dissimilar). At 1108, a second level of a second memory cell of the memory device can be sensed. At 1110, the second level can be compared to a second reference. Such second reference can be bounded by non-overlapping threshold bit levels associated with the second memory cell, the first memory cell, or both. At 1112, dissimilar bit levels associated with the second memory cell can be discarded. Such bit levels can be dissimilar, for example, with respect to the second reference. At 1114, the first level can be compared to the remaining bit levels associated with the first memory cell. Such comparison can uniquely define a first memory cell bit value, from overlapping memory cell threshold values.

Figure 13:
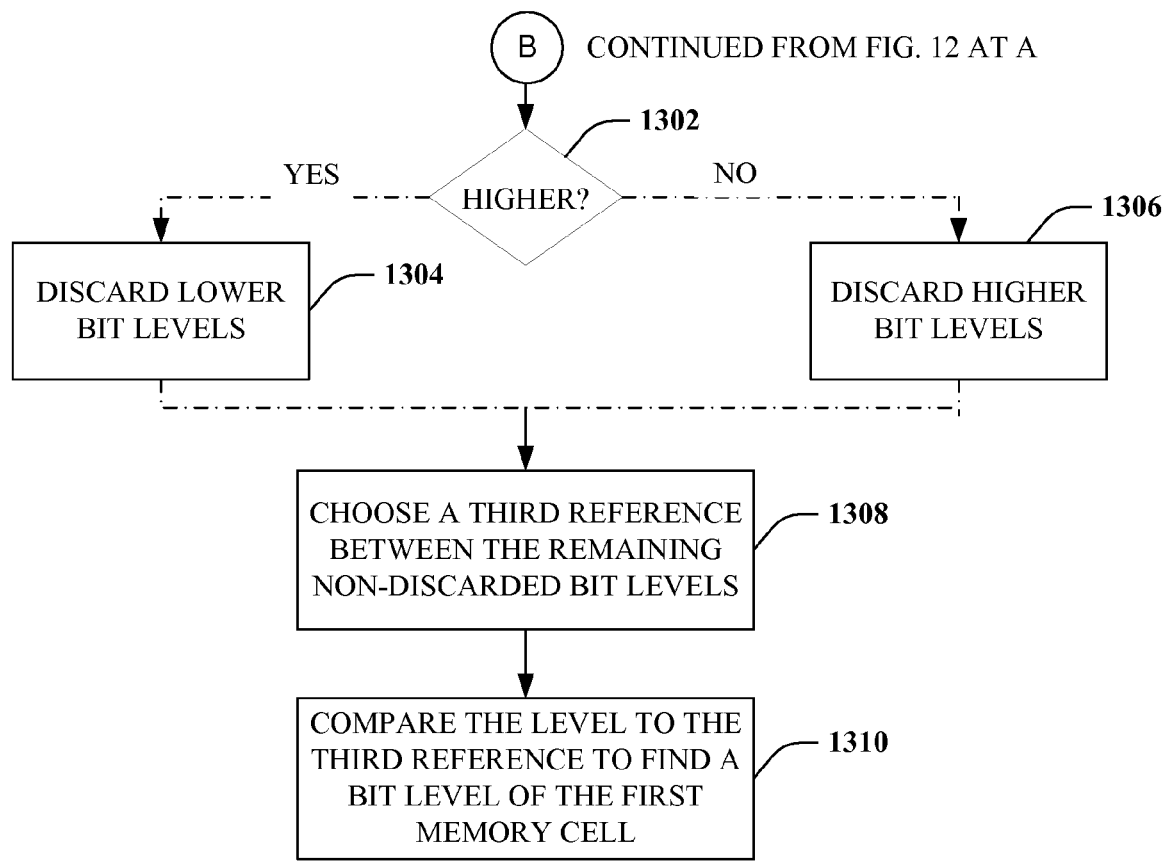

FIGS. 2 and 13 depict an example methodology 1200 in accord with particular aspects of the claimed subject matter. At 1202, a level of a first memory cell of a quad-bit dual-cell memory device can be sensed. Such sensing can be performed by a sensing component as described herein. Furthermore such first memory cell can have levels associated with discrete bits, wherein the discrete bit levels can be shifted by bit levels of adjacent memory cells, such that one or more bit levels of the first memory cell can be indistinguishable as a result of the sensing at reference 1202. At 1204, a reference can be chosen between four bit levels of the first memory cell. Such a reference can, for example, be associated with a threshold level between threshold levels of a first and second bit state of the first memory cell, and threshold levels of a third and fourth bit state of the first memory cell, wherein the threshold levels of the first and second bit states do not overlap the threshold levels of the third and fourth bit states. At 1206, a comparison can be made between the level sensed at reference 1202 and the reference chosen at 1204.

At 1208, a determination can be made relating to the comparison at 1206. If the level is higher than the reference, methodology 1200 proceeds to 1210 where bit states corresponding to threshold levels lower than the reference are discarded. If the determination at 1208 results in the level being lower than the reference, methodology 1200 proceeds to 1212 where bit states corresponding to threshold levels higher than the reference are discarded. Subsequent to discarding bit states, methodology proceeds to 1214 where a second level of a second memory cell of the quad-bit, dual-cell memory device can be sensed. Such sensing can be substantially similar to that performed at reference number 1202. At 1216, a reference between threshold levels associated with two non-discarded bit levels of the second memory cell can be chosen. At 1218, the second memory cell level can be compared to the second reference. Methodology 1200 proceeds from reference number 1218 at FIG. 12, to reference number 1302 at FIG. 13.

At 1302, a determination can be made relating to the comparison of the second memory cell level and the second reference at 1218. If, as a result of such comparison, the second memory cell level is determined to be higher than the second reference, methodology 1200 proceeds to 1304 where bit levels corresponding to lower threshold levels, as compared with the second reference, are discarded. If as a result of the comparison at reference number 1218, the second memory cell level is determined to be higher than the second reference, methodology 1200 proceeds to 1306 where bit levels corresponding to lower threshold levels, as compared with the second reference, are discarded. At 1308, a third reference can be chosen between remaining non-discarded bit levels associated with the first memory cell. At 1310, the level measured at reference number 1202 (or alternatively a new measurement level of the first memory cell also performed at 1310) can be compared to the third reference to identify a bit level associated with the first memory cell.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

As utilized herein, terms "component," "system," "interface," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Moreover, the word "exemplary" is used herein to mean serving as an example, instance, or illustration. Any aspect or design described herein as "exemplary" is not necessarily to be construed as preferred or advantageous over other aspects or designs.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

Figure 14:
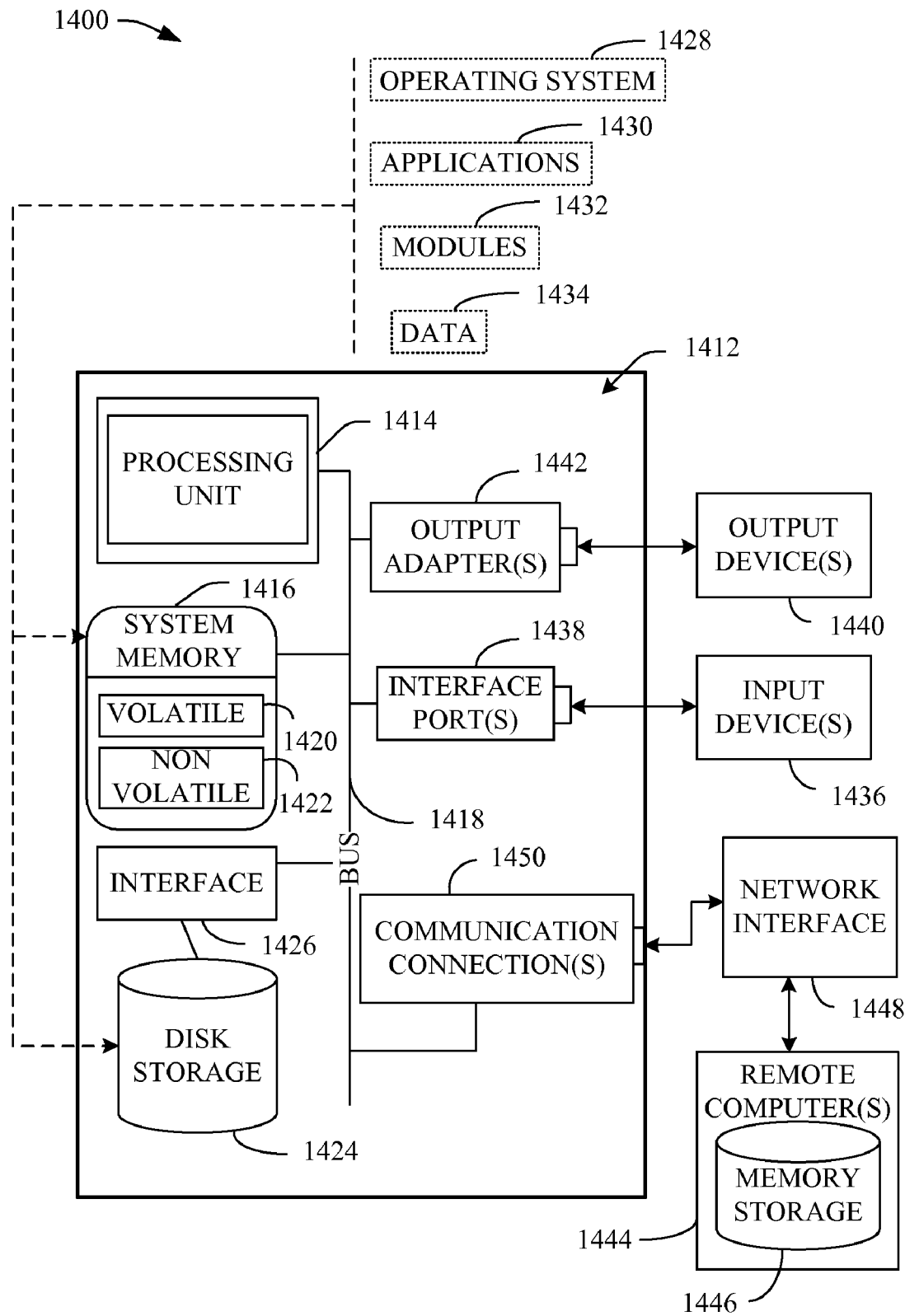
FIG. 14 is a block diagram of a suitable operating environment that can interface with a quad-bit memory device.
Figure 15:
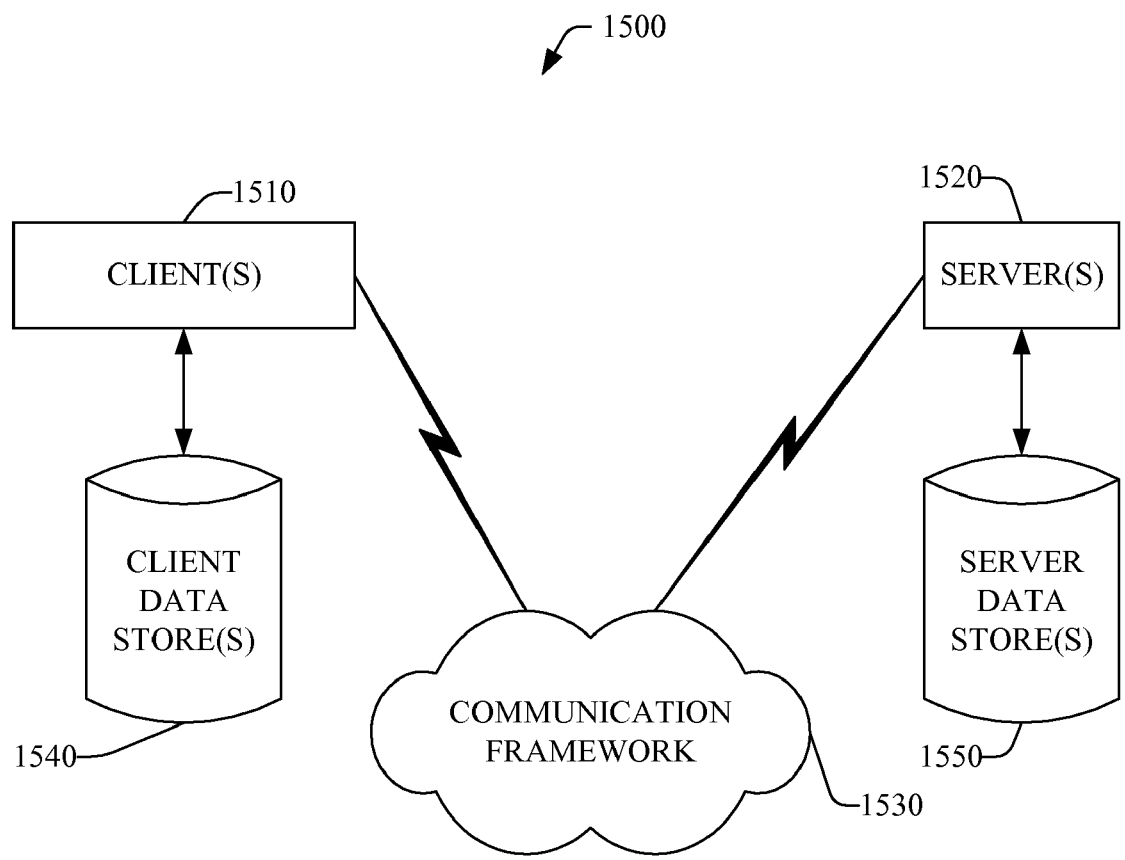
FIG. 15 is a schematic block diagram of a sample networking environment usable in conjunction with a quad-bit memory device.

In order to provide a context for the various aspects of the disclosed subject matter, FIGS. 14 and 15, as well as the following discussion, are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone computers. In a distributed computing environment, program modules may be located in both local and remote memory storage devices.

With reference to FIG. 14, a suitable environment 1400 for implementing various aspects of the claimed subject matter can include a computer 1412. The computer 1412 includes a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414.

The system bus 1418 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1416 includes volatile memory 1420 and nonvolatile memory 1422. The basic input/output system (BIOS), containing the basic routines to transfer information between elements within the computer 1412, such as during start-up, is stored in nonvolatile memory 1422. By way of illustration, and not limitation, nonvolatile memory 1422 can include ROM, PROM, electrically programmable ROM (EPROM), electrically erasable programmable ROM (EEPROM), or flash memory. Volatile memory 1420 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1412 also includes removable/non-removable, volatile/non-volatile computer storage media. FIG. 14 illustrates, for example, a disk storage 1424. Disk storage 1424 includes, but is not limited to, devices like a magnetic disk drive, floppy disk drive, tape drive, Jaz drive, Zip drive, LS-100 drive, flash memory card, or memory stick. In addition, disk storage 1424 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1424 to the system bus 1418, a removable or non-removable interface is typically used, such as interface 1426.

It is to be appreciated that FIG. 14 describes software that acts as an intermediary between users and the basic computer resources described in the suitable operating environment 1400. Such software includes an operating system 1428. Operating system 1428, which can be stored on disk storage 1424, acts to control and allocate resources of the computer system 1412. System applications 1430 take advantage of the management of resources by operating system 1428 through program modules 1432 and program data 1434 stored either in system memory 1416 or on disk storage 1424. It is to be appreciated that the disclosed subject matter can be implemented with various operating systems or combinations of operating systems.

A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436. Thus, for example, a USB port may be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a means of connection between the output device 1440 and the system bus 1418. It should be noted that other devices and/or systems of devices provide both input and output capabilities such as remote computer(s) 1444.

Computer 1412 can operate in a networked environment using logical connections to one or more remote computers, such as remote computer(s) 1444. The remote computer(s) 1444 can be a personal computer, a server, a router, a network PC, a workstation, a microprocessor based appliance, a peer device or other common network node and the like, and typically includes many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1450 refers to the hardware/software employed to connect the network interface 1448 to the bus 1418. While communication connection 1450 is shown for illustrative clarity inside computer 1412, it can also be external to computer 1412. The hardware/software necessary for connection to the network interface 1448 includes, for exemplary purposes only, internal and external technologies such as, modems including regular telephone grade modems, cable modems and DSL modems, ISDN adapters, and Ethernet cards.

FIG. 15 is a schematic block diagram of a sample-computing environment 1500 with which the subject innovation can interact. The system 1500 includes one or more client(s) 1510. The client(s) 1510 can be hardware and/or software (e.g., threads, processes, computing devices). The system 1500 also includes one or more server(s) 1520. Thus, system 1500 can correspond to a two-tier client server model or a multi-tier model (e.g., client, middle tier server, data server), amongst other models. The server(s) 1520 can also be hardware and/or software (e.g., threads, processes, computing devices). The servers 1520 can house threads to perform transformations by employing the subject innovation, for example. One possible communication between a client 1510 and a server 1520 may be in the form of a data packet transmitted between two or more computer processes.

The system 1500 includes a communication framework 1530 that can be employed to facilitate communications between the client(s) 1510 and the server(s) 1520. The client(s) 1510 are operatively connected to one or more client data store(s) 1540 that can be employed to store information local to the client(s) 1510. Similarly, the server(s) 1520 are operatively connected to one or more server data store(s) 1550 that can be employed to store information local to the servers 1520.

What has been described above includes examples of the various embodiments. It is, of course, not possible to describe every conceivable combination of components or methodologies for purposes of describing the embodiments, but one of ordinary skill in the art may recognize that many further combinations and permutations are possible. Accordingly, the detailed description is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments includes a system as well as a computer-readable medium having computer-executable instructions for performing the acts and/or events of the various methods. In addition, while a particular feature may have been disclosed with respect to only one of several implementations, such feature may be combined with one or more other features of the other implementations as may be desired and advantageous for any given or particular application.

What is claimed is:

1. A device for determining a programmed state of a quad-bit dual-cell memory device, comprising:
    a processor;
    a memory, communicatively coupled to the processor, the memory storing processor executable instructions, which when executed by the processor, cause the device to measure a bit level of the quad-bit dual cell memory device, the instructions comprising:
    a sensing component that measures a first level of a first memory cell and a second level of a second memory cell; and
    a comparison component that relates the second level to a fixed reference, and relates the first level to the fixed reference, and determines the programmed state of the memory device by eliminating states of the quad-bit dual cell memory device having bit distribution levels which overlap the programmed state, based at least in part on the relation between the first level and the fixed reference, and on the relation between the second level and the fixed reference.

2. The device of claim 1, wherein the fixed reference includes a constant memory cell level for comparison to memory cell bit levels.

3. The device of claim 2, wherein the constant memory cell level further includes at least one of: a constant current, a non-varying bit, or an experimentally determined value.

4. The device of claim 1, further comprising a division component that discards a bit level associated with the second memory cell that is dissimilar to the second level, as related to the fixed reference.

5. The device of claim 1, wherein the comparison component further relates the first level to a second fixed reference, wherein determining the programmed state of the quad-bit dual-cell memory device is further based at least in part on a relation between the first level and the second reference.

6. The device of claim 1, wherein the fixed reference is bounded by two or more bit levels associated with the second memory cell.

7. The device of claim 5, wherein the second fixed reference is bounded by two or more bit levels associated with the first memory cell.

8. A method for determining a programmed state of a quad-bit dual-cell memory device, comprising:
    sensing a first level of a first memory cell of the quad-bit dual-cell memory device, and a second level of a second cell of the quad-bit dual-cell memory device;
    comparing the first level to a first constant reference, and the second level to the first constant reference; and
    determining the programmed state of the quad-bit dual-cell memory device by eliminating quad-bit dual-cell states that overlap the bit levels of the programmed state, based at least in part on the comparing.

9. The method of claim 8, wherein the first constant reference is bounded by at least two predetermined bit levels associated with the first memory cell.

10. The method of claim 8, further comprising comparing the second level with a second constant reference.

11. The method of claim 10, the second constant reference is bounded by at least two predetermined bit levels associated with the second memory cell.

12. The method of claim 10, further comprising comparing the second level with a third constant reference.

13. The method of claim 8, wherein the determining includes comparing the second level with the first constant reference, wherein the first constant reference distinguishes between two pairs of non-overlapping bits of the quad-bit dual-cell memory device.

14. A device configured to determine the programmed states of multiple quad-bit dual cell memory devices, comprising:
    means for processing machine executable instructions;
    means for storing computer executable instructions, communicatively coupled to the means for processing, and having stored therein computer executable instructions, comprising:
    means for sensing a cell bit distribution level associated with a first group of cells of the multiple quad-bit dual cell memory devices and a second group of cells of the multiple quad-bit dual cell memory devices;
    means for establishing a constant reference between two or more non-overlapping cell group bit distribution levels of the first or second group of cells, or both; and
    means for determining the programmed states of the multiple quad-bit dual cell memory devices including eliminating cell bit distribution levels associated with the first group of cells and the second group of cells based, at least in part, on comparison of the cell bit distribution level associated with the first group of cells and the constant reference, and based on comparison of the cell bit distribution level associated with the second group of cells and the constant reference.

15. The device of claim 14, the instructions further comprising means for matching the bit distribution level associated with the second group of cells with a second predetermined bit level associated with the second group of cells based on a second comparison to a second constant reference.

16. The device of claim 15, wherein the eliminating is further based, at least in part on the second comparison with the second constant reference.

17. The device of claim 16, wherein the second constant reference is between two or more non-overlapping bit distribution levels of the second group of cells.

18. The device of claim 16, wherein the second constant reference is compared to the cell bit distribution level of the first group of cells to fully distinguish the bit distribution level associated with the first group of cells.

19. The method of claim 10, wherein the determining is further based, at least in part, on the comparing the second level with a second constant reference.

20. The method of claim 12, wherein the determining is further based, at least in part, on the comparing the second level with a second constant reference and the comparing the second level with a third constant reference.

* * * * *